United States Patent
Spargo et al.

(10) Patent No.: US 6,636,730 B2
(45) Date of Patent: *Oct. 21, 2003

(54) WIDEBAND IF IMAGE REJECTING RECEIVER

(75) Inventors: Thomas A. Spargo, Hermosa Beach, CA (US); Lloyd F. Linder, Agoura Hills, CA (US); Matthew S. Gorder, Riverside, CA (US)

(73) Assignee: TelASIC Communications, Inc., El Segundo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/220,288

(22) Filed: Dec. 23, 1998

(65) Prior Publication Data

US 2002/0055347 A1 May 9, 2002

(51) Int. Cl.[7] .................................................. H04B 1/12
(52) U.S. Cl. ........................ 455/302; 455/304; 455/307; 455/313
(58) Field of Search ................................ 455/302, 303, 455/304, 313, 314, 208, 209, 305, 306, 307; 330/281

(56) References Cited

U.S. PATENT DOCUMENTS 5,523,575 A * 6/1996 Machida et al. ........ 330/281 X
5,678,220 A * 10/1997 Fournier .................... 455/302

FOREIGN PATENT DOCUMENTS

EP    0-715 403 A    5/1996

OTHER PUBLICATIONS

Tietze, U; Schenk, CH : "Halbleiter–Schaltungstechnik" 1990, Springer, Berlin XP–002130542, pp. 438–442.*

"Design of Constant Phase Difference Networks," by Thomas A. Keely; RF Design, Apr. 1989 (4 pp).

* cited by examiner

Primary Examiner—Nay Maung
Assistant Examiner—Philip J. Sobutka
(74) Attorney, Agent, or Firm—Morrison & Forester LLP

(57) ABSTRACT

A system and method for effecting wideband image rejection. In a receiver implementation, the inventive method includes the steps of receiving a first signal in a first frequency band and generating in-phase and quadrature signals therefrom. The phase of the in-phase signal is shifted to provide a second signal and the phase of the quadrature signal is shifted to provide a third signal. A predetermined phase relationship is thereby effected between the second and the third signals. The second and third signals are then summed to provide an output signal which has minimal interference from a mixing signal. In an illustrative receiver application, the phase shifting is achieved via the use of all pass networks. Each of the all pass networks include a differential amplifier having first and second input terminals. The first and the second terminals are connected to a first end of first and second resistive elements, respectively. The second ends of the first and second resistive elements are connected to a common input terminal for the network. The first input terminal is a negative terminal and is connected to an output terminal of the network. The second terminal is a positive terminal and is connected to a source of ground potential via a capacitive element.

2 Claims, 3 Drawing Sheets

WIDEBAND IF IMAGE REJECTING RECEIVER

BACKGROUND OF THE INVENTION

1. Field of the Invention

The present invention relates to communications systems. More specifically, the present invention relates to systems and techniques for receiving signals over a wide range while preventing interference from intermediate frequency (IF) images with desired signals.

2. Description of the Related Art

Reception of electromagnetic signals is effected by a transmission and reception of signals in a first relatively high frequency band (such as radio frequency or 'RF') and subsequent downconversion of the received signal to a lower frequency band (such as IF.) Downconversion is typically achieved by mixing the received signal with a reference signal generated by a local oscillator (LO). For example, an RF signal received at a frequency of 1000 kilohertz (kHz) might be mixed down to 100 kHz by a mixer having a 900 kHz reference signal from a local oscillator. Under these conditions, a signal at 800 kHz would have the same IF (intermediate frequency) and would therefore interfere with the desired signal at 1000 kHz. When mixing two signals, provision must be made to prevent the mixing image from interfering with the desired signal. At least three techniques are known in the art for minimizing the interfering effects of mixing images.

A first technique involves the use of a narrowband filter in front of the mixer. Unfortunately, this approach suffers from the requirement of a customized design for each desired frequency of operation.

A second approach involves the use of tuned amplifiers, instead of filters, in front of the mixer. Unfortunately, it has been difficult to achieve consistent gain and bandwidth rejection over a wide range in a tuned amplifier. In addition, slight variations in component characteristics between amplifiers disposed in separate paths in the mixer impede the ability of the amplifiers to track each other with sufficient accuracy for many demanding applications.

In accordance with a third approach, image rejecting mixers using passive phase shifters are used in place of filters. Passive phase shifting networks shift phase over a single frequency or a narrow band of frequencies. Subsequently, changing the output frequency requires a redesign or retuning of the network, both of which add cost and complexity to the system. This is particularly problematic in a frequency-hopping environment where external tuning networks could be used but would slow the speed at which frequency hopping would be permitted.

Hence, a need exists in the art for an improved, yet inexpensive system or technique for rejecting mixing images in radio frequency receivers over a wide frequency range.

SUMMARY OF THE INVENTION

The need in the art is addressed by the system and method of the present invention for effecting wideband image rejection. In a receiver implementation, the inventive method includes the steps of receiving a first signal in a first frequency band and generating in-phase and quadrature signals therefrom. The phase of the in-phase signal is shifted to provide a second signal and the phase of the quadrature signal is shifted to provide a third signal. A predetermined phase relationship is thereby effected between the second and the third signals. The second and third signals are then summed to provide an output signal which has minimal interference from a mixing signal.

In the illustrative embodiment, the phase shifting is achieved via the use of all pass networks. In an illustrative implementation, each of the all pass networks include a differential amplifier having first and second input terminals. The first and the second terminals are connected to a first end of first and second resistors, respectively. The second ends of the first and second resistors are connected to a common input terminal for the network. The first input terminal is a negative terminal and is connected to an output terminal of the network. The second terminal is a positive terminal and is connected to a source of ground potential via a capacitive element.

Whether implemented in a receiver or as a general-purpose mixer, the inventive mixer offers a wide-band output stage and affords good gain matching over a wide bandwidth. This allows good image rejection over a wide bandwidth. Hence, the inventive mixer may be used in high-speed frequency hopping applications without substantial changes in the design thereof.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
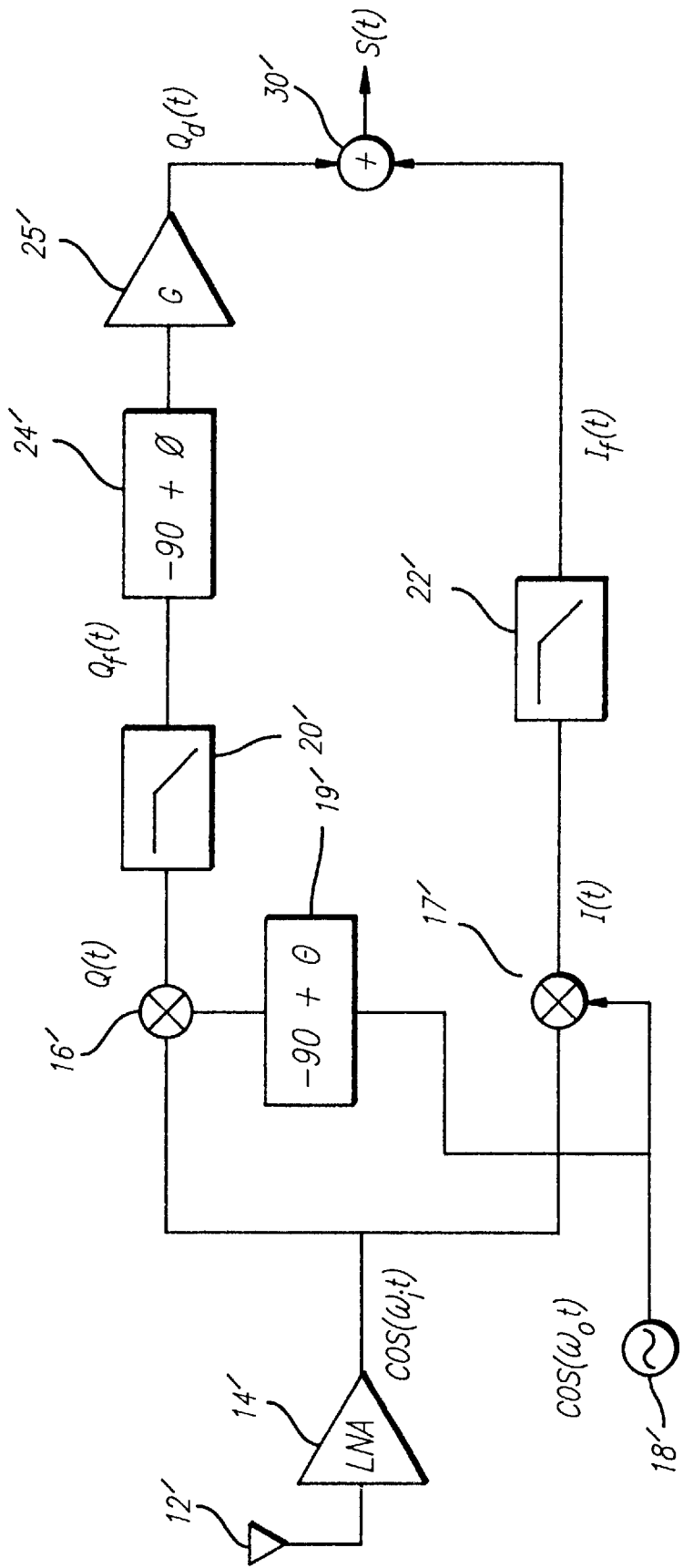
FIG. 1 is a block diagram of a typical conventional implementation of an image rejecting receiver.

FIG. 1 is a block diagram of a typical conventional implementation of an image rejecting receiver. The receiver 10' includes an antenna 12' which provides a received signal to a Low Noise Amplifier (LNA) 14'. The LNA14' outputs an RF (radio frequency) signal to first and second mixers 16' and 17', respectively. A local oscillator 18' provides a reference signal to the second mixer 17'. This signal is shifted 90° by a first phase shifter 19'. The output of the first phase shifter 19' provides a reference signal for the first mixer 16'.

In response, the first and second mixers 16' and 17' output in-phase and quadrature IF (intermediate frequency) signals, respectively. The in-phase and quadrature signals are input to first and second low pass filters 20' and 22', respectively. The output of the first low pass filter is input to a second phase shifter 24'. The outputs of the second phase shifter 24' and the second low pass filter 22' are summed by a summer 30' to provide an output signal for the receiver 10'.

Due to the relative phase shifting of the two signals, any frequencies below the local oscillator frequency are attenuated relative to the frequencies above the local oscillator frequency. The amount of attenuation depends on how accurately the 90° phase shifts are and how accurately the gain match is between the two paths.

The 90° phase shift is conventionally performed using an RC (resistive-capacitive) filter. Since the frequency of the local oscillator 18' stays constant and the mixer gain is insensitive to small local oscillator amplitude mismatches, acquisition of a 90° phase shift is not problematic at that frequency. In the IF stage, the gain in the two paths must match substantially exactly to obtain good image rejection. However, simple RC filters will only have matching gain and a 90° phase shift at one frequency. Hence, good image rejection may only be obtained at one frequency. As mentioned above, this may be problematic for some current, more demanding applications. Hence, a need has existed in the art for an improved, yet inexpensive system or technique for rejecting mixing images in radio frequency receivers over a wide frequency range. This need is addressed by the system and method for effecting wideband image rejection of the present invention.

Figure 2:
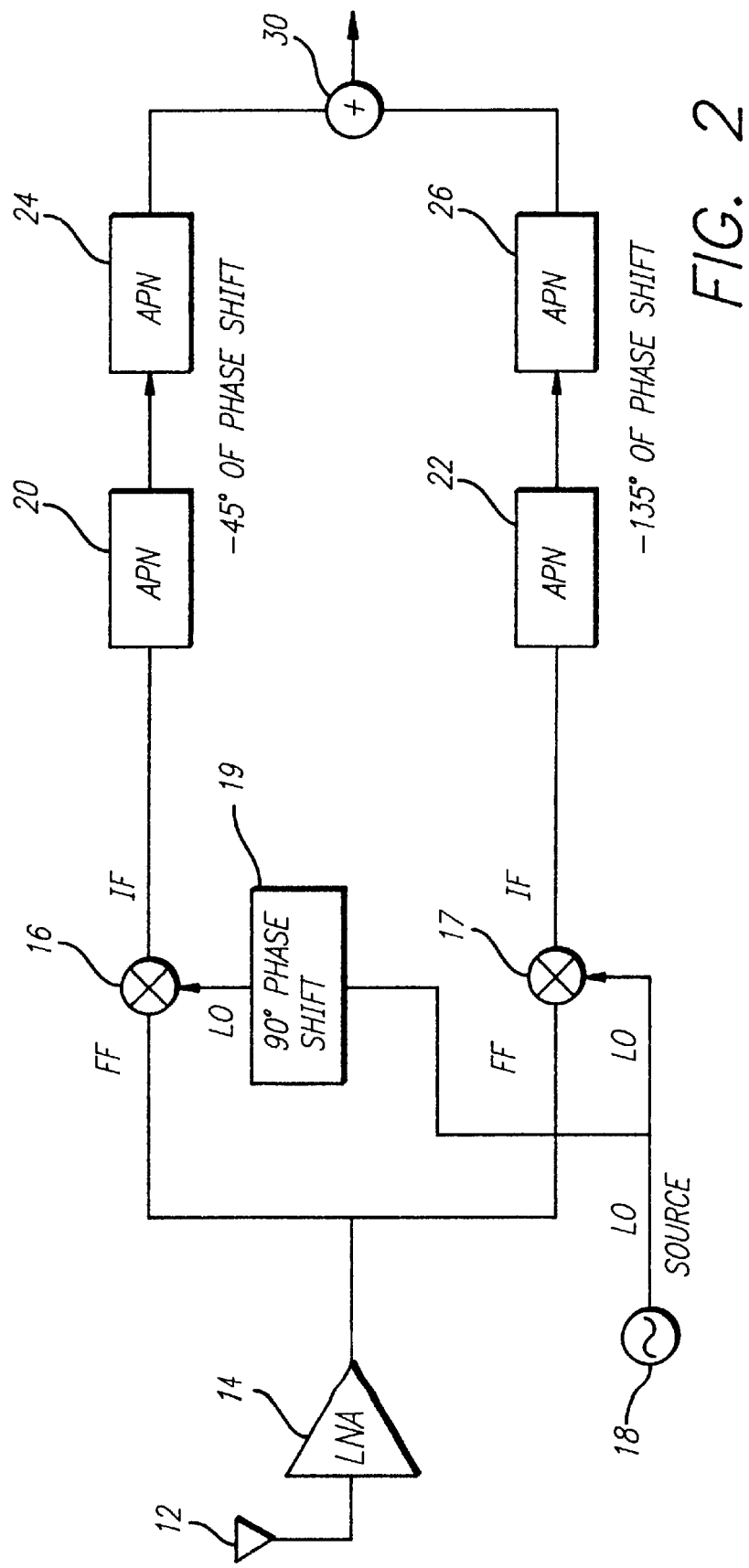
FIG. 2 is a block diagram of an illustrative implementation of a receiver in accordance with the present teachings.

FIG. 2 is a block diagram of an illustrative implementation of a receiver in accordance with the present teachings. As per the conventional receiver 10' of FIG. 1, the inventive receiver 10 includes an antenna 12 which provides a received signal to a LNA 14. The LNA 14 outputs an RF (radio frequency) signal to first and second mixers 16 and 17, respectively. A local oscillator 18 provides a reference signal to the second mixer 17. This signal is shifted 90° by a first phase shifter 19. The output of the first phase shifter 19 provides a reference signal for the first mixer 16.

In response, the first and second mixers 16 and 17 output in-phase and quadrature IF (intermediate frequency) signals, respectively. The first mixer actually output the Quadrature signal. The in-phase and quadrature signals are input to first and second all pass networks 20 and 22, respectively. The output of the first all pass network 20 is input to a third all pass network 24. The outputs of the second all pass network 22 is input to a fourth all pass network 26. The outputs of the third and fourth all pass networks 24 and 26 are summed by a summer 30 to provide an output signal for the inventive receiver 10.

Figure 3:
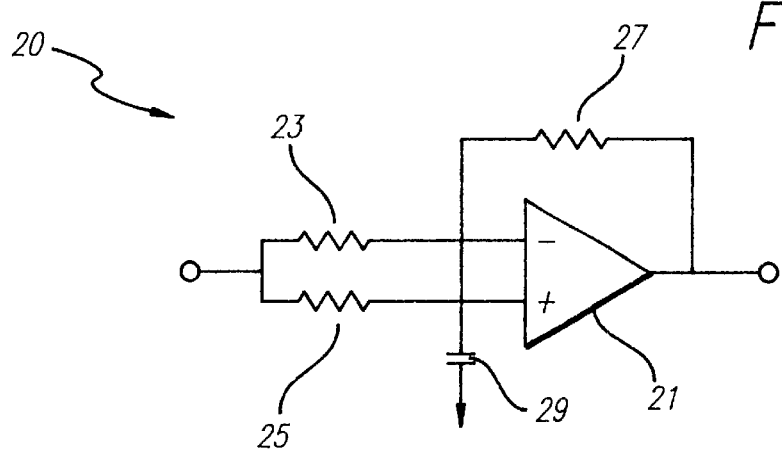
FIG. 3, is an illustrative implementation of an all pass network (APN) utilized in the present invention.

FIG. 3, is an illustrative implementation of an all pass network (APN) utilized in the present invention. As the all pass networks (APNs) of FIG. 2 are of identical design (albeit with different resistor and capacitor value), only one all pass network (APN) is detailed in FIG. 3. The all pass network (APN) 20 includes a differential amplifier 21. The amplifier 21 has first and second input terminals being connected to a first end of first and second resistors 23 and 25, respectively. A second end of the first and second resistors being connected to a common input terminal for the network. The first input terminal of the amplifier 21 is a negative terminal and is connected to an output terminal thereof via a third resistive element 27. The second input terminal of the amplifier 21 is a positive terminal and is connected to a source of ground potential via a capacitive element 29. Resistors for each all pass network (APN) need to be made so that their ratios remain constant with process variations. Capacitors also have the same requirements for each all pass network (APN). The RC product of each all pass network (APN) needs to be staggered correctly to obtain the widest bandwidth with constant 90° phase difference with minimal error from 90°. The amplifiers should be designed so that all four give identical gains and very little phase shift at the output frequencies.

Returning to FIG. 2, the frequency of the local oscillator 18 is set below the frequency of the desired signal. The equation below sets forth a mathematical basis for practicing the present invention.

$$IRR=-20*\log(sqrt((1+G?2-2*G*\cos(phi+theta))/(1+G?2+2*G*\cos(phi-theta))))$$

where:
  G=the gain mismatch between the in-phase and quadrature paths in decimal.
  phi=deviation from 90° phase delay in the quadrature path.
  theta=deviation from quadrature in the LO's Hence, the use of all pass networks (APNs) affords a constant relative phase shift with constant gain versus frequency. As illustrated above, two all pass networks (APNs), one in each path, can be used to obtain a 90° relative phase shift over a certain bandwidth. The all pass network (APN) in one path provides a 45° phase shift while the all pass network (APN) in the second path provides a 135° phase shift for a relative phase shift of 90°. By cascading two sets of all pass networks (APNs) as illustrated in FIG. 2, a 90° relative phase shift can be maintained over a wider bandwidth. For example, four all pass networks (APNs) can be used to obtain 90° of phase shift over a range of 10 MHz to 50 MHz. Using the present teachings, a receiver may be implemented to provide over 20 dB of image rejection from five MHz to over 100 MHz as depicted in FIG. 4.

Figure 4:
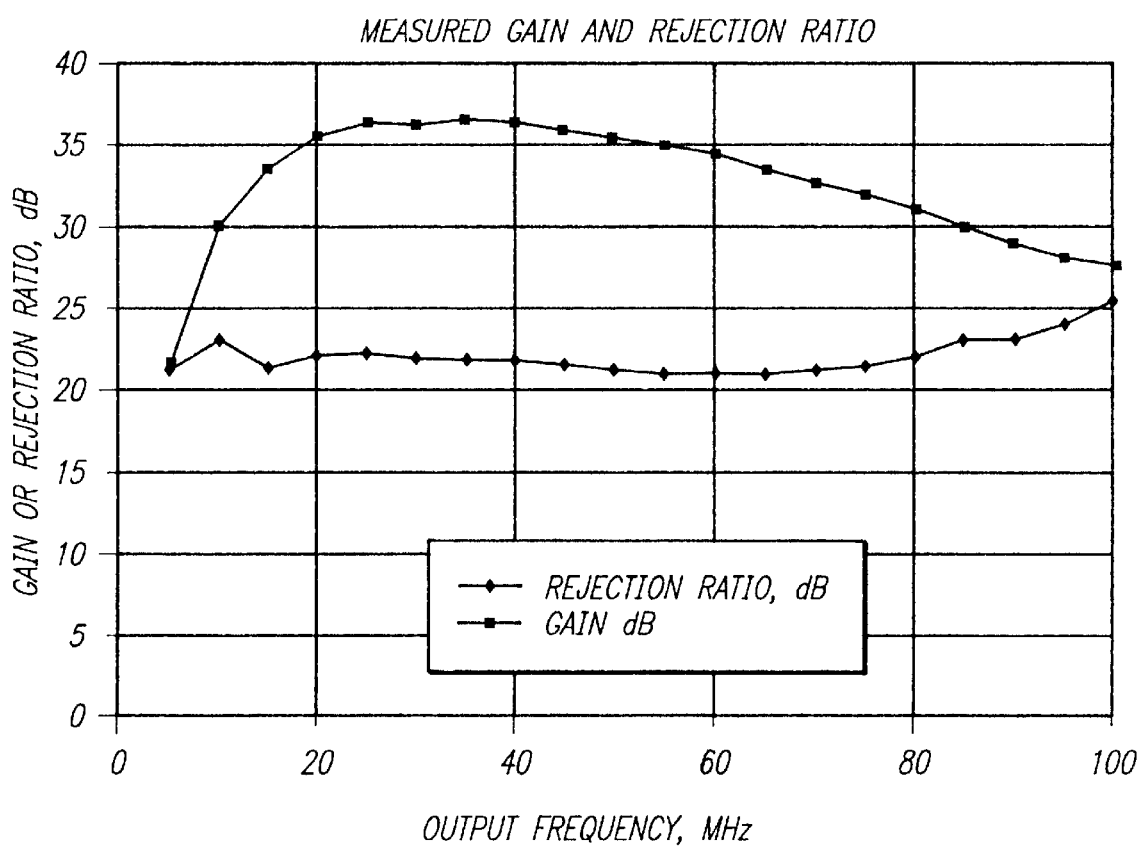
FIG. 4 is a graph of output frequency versus gain and rejection ratio for an illustrative implementation of a receiver constructed in accordance with the teachings of the present invention.

FIG. 4 is a graph of output frequency versus gain and rejection ratio for an illustrative implementation of a receiver constructed in accordance with the teachings of the present invention. The key parameters of a receiver implemented in accordance with the present teachings and yielding the performance depicted in FIG. 4 are:
  a) Output frequency range, from Flow to Fhigh.
  b) Desired output phase ripple (total peak-to-peak deviation from 90° phase shift).
  c) Number of pole-zero pairs needed to obtain 'b' over the frequency range in 'a'.

From these numbers the pole-zero frequencies can be calculated, and from them and considerations set forth above, the actual resistor and capacitor values can be calculated.

Thus, the present invention has been described herein with reference to a particular embodiment for a particular application. Those having ordinary skill in the art and access to the present teachings will recognize additional modifications applications and embodiments within the scope thereof. For example, the inventive teachings are not limited to use in a receiver. A mixer constructed in accordance with the teachings of the present invention may be utilized in any of a number of applications in which image rejection over a wide range of frequencies is desired.

It is therefore intended by the appended claims to cover any and all such applications, modifications and embodiments within the scope of the present invention.

Accordingly,
What is claimed is:
1. A wideband image rejecting mixer comprising:
  first means for providing a first signal in a first frequency band;
  second means for generating in-phase and quadrature signals from said first received signal, said second means including a fixed local oscillator (LO) source;
  third means including wideband first and second all pass networks for shifting the phase of said in-phase signal to provide a second signal;

fourth means including wideband third and fourth all pass networks for shifting the phase of said quadrature signal to provide a third signal, whereby said second signal has a predetermined phase shift relative to said third signal; and fifth means for summing said second and said third signals.

2. The invention of claim 1 wherein each of said all pass networks include a differential amplifier having first and second input terminals, said first and said second terminals being connected to a first end of first and second resistive elements, respectively, a second end of said first and second resistive elements being connected to a common input terminal for said network, said first input terminal being a negative terminal and being connected to an output terminal of said network via a third resistive element and said second terminal being a positive terminal and being connected to a source of ground potential via a capacitive element.

* * * * *

UNITED STATES PATENT AND TRADEMARK OFFICE
CERTIFICATE OF CORRECTION

PATENT NO. : 6,636,730 B2
DATED : October 21, 2003
INVENTOR(S) : Spargo et al.

Page 1 of 1

It is certified that error appears in the above-identified patent and that said Letters Patent is hereby corrected as shown below:

Drawings,
Delete "FIG. 3" and insert -- FIG. 3 -- as shown below:

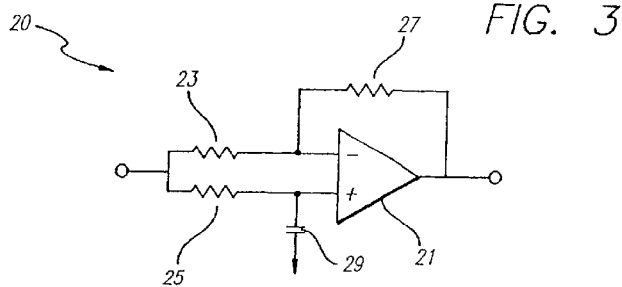

Column 4,
Line 5, the equation should read as follows:
-- IRR=-20*log(sqrt((1+G^2-2*G*cos(phi+theta))/(1+G^2+2*G*cos(phi-theta)))) --

Signed and Sealed this

Second Day of March, 2004

JON W. DUDAS
*Acting Director of the United States Patent and Trademark Office*